(12) United States Patent
Fukuhara et al.

(10) Patent No.: US 8,363,372 B2
(45) Date of Patent: Jan. 29, 2013

(54) RAPID DISCHARGING CIRCUIT UPON DETECTION OF ABNORMALITY

(75) Inventors: Jun Fukuhara, Kanagawa (JP); Tsuyoshi Mitsuda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 287 days.

(21) Appl. No.: 12/801,654

(22) Filed: Jun. 18, 2010

(65) Prior Publication Data

US 2011/0007442 A1    Jan. 13, 2011

(30) Foreign Application Priority Data

Jul. 7, 2009   (JP) ................................. 2009-160513

(51) Int. Cl.
*H02H 3/08* (2006.01)

(52) U.S. Cl. ...................................... 361/93.9; 361/93.7

(58) Field of Classification Search ......... 361/93.7–93.9
See application file for complete search history.

(56) References Cited

U.S. PATENT DOCUMENTS 4,931,778 A * 6/1990 Guajardo ...................... 340/664
7,545,198 B2 * 6/2009 Tamagawa ..................... 327/427
2005/0077948 A1   4/2005 Kojima

FOREIGN PATENT DOCUMENTS

JP         2005-123666 A    5/2005

* cited by examiner

*Primary Examiner* — Danny Nguyen

(74) *Attorney, Agent, or Firm* — McGinn IP Law Group, PLLC

(57) ABSTRACT

Provided is a protection circuit that is connected between a power supply terminal and an output terminal, and turns off an output transistor when an abnormality occurs in a system, the output transistor outputting a current to a load connected to the output terminal, the protection circuit including: a first discharge unit that is connected between a gate electrode of the output transistor and the power supply terminal, and discharges an electric charge of the gate electrode until a potential of the gate electrode becomes equal to a power supply potential, when an abnormality occurs in the system, and a second discharge unit that is connected between the gate electrode and a source electrode of the output transistor, and discharges the electric charge of the gate electrode until the potential of the gate electrode becomes equal to an output potential, when an abnormality occurs in the system.

11 Claims, 7 Drawing Sheets

Fig. 2A

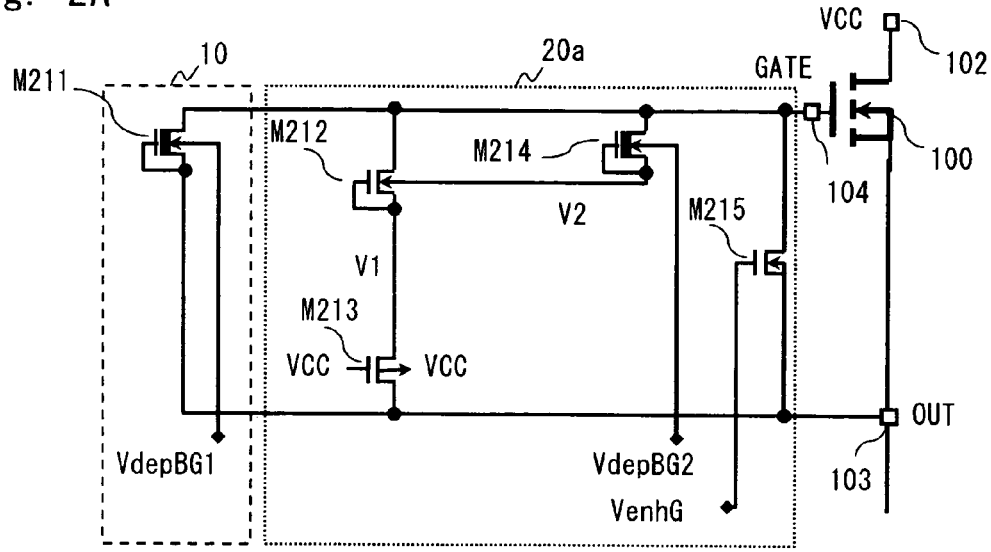

VdepBG1
NORMAL ON STATE : GNDX+α
NORMAL OFF STATE : OUT
ABNORMALITY DETECTION
STATE : GNDX+α

VenhG
NORMAL ON STATE : OUT
NORMAL OFF STATE : OUT
ABNORMALITY DETECTION
STATE : VCC VdepBG2
NORMAL ON STATE : IN+α
NORMAL OFF STATE : IN+α
ABNORMALITY DETECTION
STATE : OUT

Fig. 2B

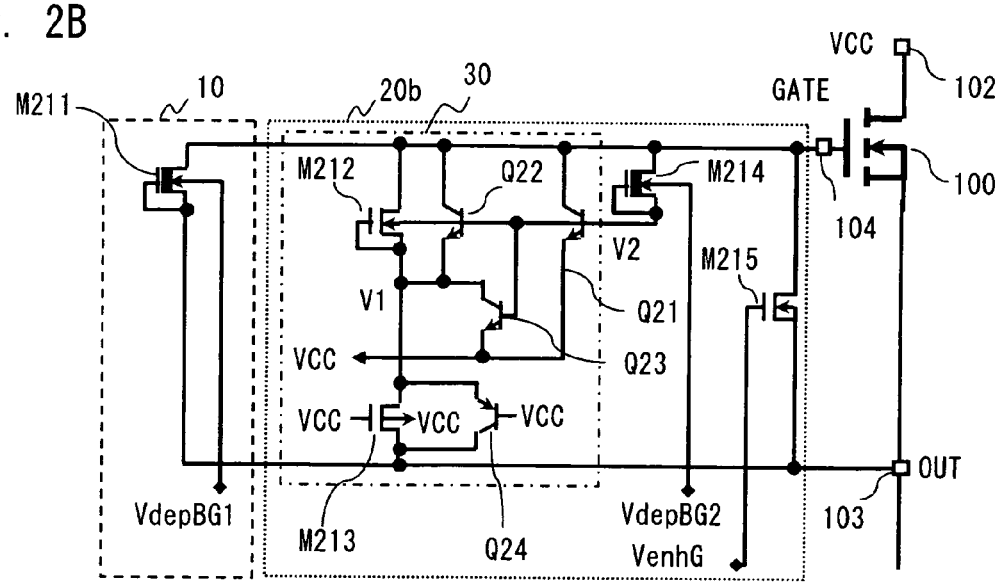

VdepBG1
NORMAL ON STATE : GNDX+α
NORMAL OFF STATE : OUT
ABNORMALITY DETECTION
STATE : GNDX+α

VenhG
NORMAL ON STATE : OUT
NORMAL OFF STATE : OUT
ABNORMALITY DETECTION
STATE : VCC VdepBG2
NORMAL ON STATE : IN+α
NORMAL OFF STATE : IN+α
ABNORMALITY DETECTION
STATE : OUT

Fig. 4A

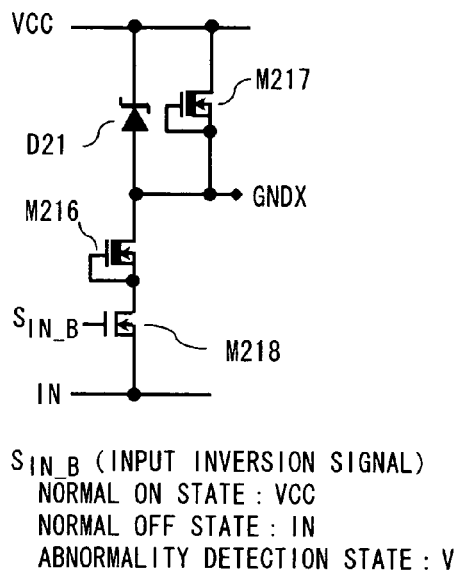

S_IN_B (INPUT INVERSION SIGNAL)
 NORMAL ON STATE : VCC
 NORMAL OFF STATE : IN
 ABNORMALITY DETECTION STATE : VCC

Fig. 4B

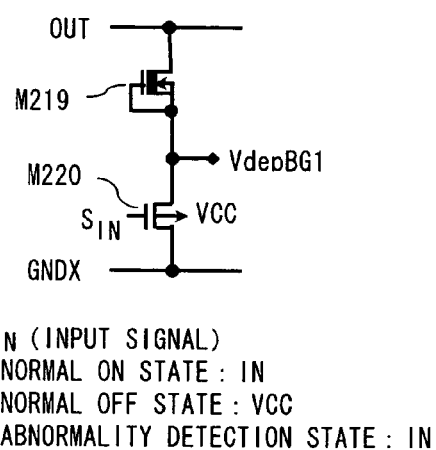

S_IN (INPUT SIGNAL)
 NORMAL ON STATE : IN
 NORMAL OFF STATE : VCC
 ABNORMALITY DETECTION STATE : IN

Fig. 4C

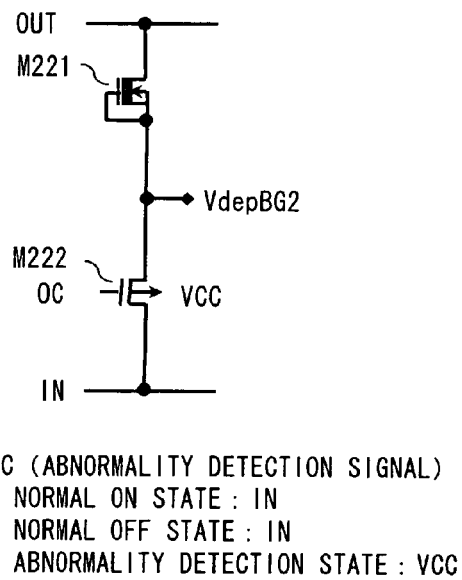

OC (ABNORMALITY DETECTION SIGNAL)
 NORMAL ON STATE : IN
 NORMAL OFF STATE : IN
 ABNORMALITY DETECTION STATE : VCC

Fig. 4D

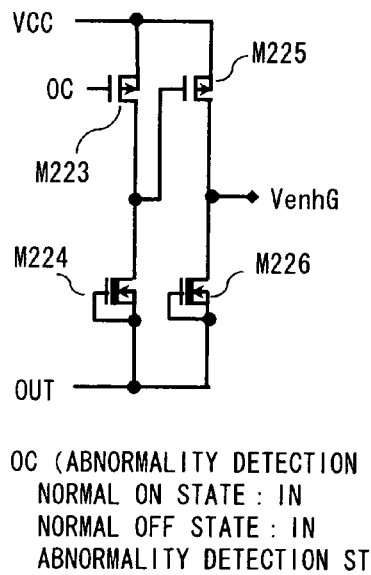

OC (ABNORMALITY DETECTION SIGNAL)
 NORMAL ON STATE : IN
 NORMAL OFF STATE : IN
 ABNORMALITY DETECTION STATE : VCC

| VdepBG1 | VenhG | VdepBG2 |
|---|---|---|
| NORMAL ON STATE : GNDX+α | NORMAL ON STATE : OUT | NORMAL ON STATE : IN+α |
| NORMAL OFF STATE : OUT | NORMAL OFF STATE : OUT | NORMAL OFF STATE : IN+α |
| ABNORMALITY DETECTION STATE : OUT+α | ABNORMALITY DETECTION STATE : VCC | ABNORMALITY DETECTION STATE : OUT |

PRIOR ART

RAPID DISCHARGING CIRCUIT UPON DETECTION OF ABNORMALITY

INCORPORATION BY REFERENCE

This application is based upon and claims the benefit of priority from Japanese patent application No. 2009-160513, filed on Jul. 7, 2009, the disclosure of which is incorporated herein in its entirety by reference.

BACKGROUND

1. Field of the Invention

The present invention relates to a semiconductor device, and more particularly, to a semiconductor device having a function of rapidly turning off upon detection of an abnormality.

2. Description of Related Art

In recent years, semiconductor devices have been used in systems having a switch function capable of driving a large current, as typified by electrical components for automobiles. Each system that drives a large current has a function of switching itself off upon detection of an overheat, an overcurrent, or the like so as to protect the system when an abnormality occurs in which a load is short-circuited and a large current flows, for example.

In the operation in which the system switches itself off upon detection of an abnormality, it is important to reduce a heat loss that occurs upon turn-off. This is because if a large heat loss occurs upon turn-off, a breakdown may occur, since it is highly possible that a large amount of heat is generated when an abnormality is detected. Accordingly, in the turn-off operation upon detection of an abnormality, it is important to rapidly turn off.

Japanese Unexamined Patent Application Publication No. 2005-123666 (Kojima et al.) discloses a technique for an output circuit that rapidly turns off. FIG. 7 is a diagram showing the configuration of the output circuit according to the technique disclosed by Kojima et al. Referring to FIG. 7, an output circuit 300 includes an output MOS 100 which is connected between a power supply terminal and an output terminal. The output MOS 100 is an N-type enhancement transistor having a circuit switching function. A transistor Q1 and a transistor Q2 are N-type depletion or enhancement transistors. A transistor Q3 is an N-type enhancement transistor. A resistor R1 is connected between the transistor Q1 and the output terminal, and a resistor R2 is connected between the transistor Q2 and the output terminal. Thus, the transistors Q1 to Q3 form three discharge paths between the gate terminal of the output MOS 100 and the output terminal. The output circuit 300 also includes a state determination circuit 304 that controls the discharge of an electric charge stored in the gate electrode of the output MOS 100 by selecting the discharge paths. The output circuit 300 further includes a control signal input circuit 301, a booster circuit 302, and a rise rate 303, which are blocks for controlling the output MOS 100 in the normal state.

In the normal state, the control signal input circuit 301 receives a signal for turning on and off the output MOS 100. Based on the signal, the booster circuit 302 outputs a boosted voltage to the gate terminal through the rise rate 303. In the case of turning off the output MOS in the normal state, the booster circuit 302 suspends operation and the state determination circuit 304 detects a voltage between the power supply terminal and the output terminal, based on the signal output from the control signal input circuit 301. The output circuit 300 includes a discharge path formed of the transistor Q1 and the resistor R1, a discharge path formed of the transistor Q2 and the resistor R2, and a discharge path formed of the transistor Q3. Based on the signal output from the state determination circuit 304, one or more discharge paths are activated to discharge a gate charge of the output MOS to the output terminal, thereby turning off the output MOS.

The state determination circuit 304 measures a voltage between the power supply terminal and the output terminal and detects whether an overcurrent flows, for example, thereby detecting an abnormality. In this case, an OFF signal for forcibly turning off the MOS 100 is input to the control signal input circuit 301. Further, based on the signal output from the state determination circuit 304, one or more of the three discharge paths are activated to discharge the gate charge of the output MOS to the output terminal, thereby turning off the output MOS.

In the turn-off operation in the normal state, the transistor Q1 is activated. In a rapid turn-off operation in an overcurrent state, only the transistor Q3 or both the transistor Q1 and the transistor Q2 are activated at the same time. In the turn-off operation when a current which is larger than that in the normal state and smaller than an overcurrent flows, only the transistor Q2 or both the transistor Q2 and the transistor Q1 are activated at the same time, thereby adjusting the slew rate.

In the overcurrent state, the operation of the transistor Q3, which is an enhancement transistor, is especially important. The rapid turn-off operation is accomplished in such a manner that the transistor Q3 rapidly discharges the gate charge of the output MOS. Next, the operation of the transistor Q3 will be described in detail. Herein, a description is given to the following two cases:

(1) a case where the rapid turn-off operation is accomplished by activating only the transistor Q3; and
(2) a case where the rapid turn-off operation is accomplished by activating all the transistors Q1 to Q3.

(1) The Case where the Rapid Turn-Off Operation is Accomplished by Activating only the Transistor Q3

Assuming that a gate-source voltage of the transistor Q3 is Vgs3 and a threshold voltage is Vthn, Vgs3>Vthn should be satisfied in order to turn on the transistor Q3. Assuming that a gate voltage is Vx, the threshold voltage of the transistor Q3 is Vthn, and an output voltage is OUT, Vx−OUT>Vthn is established, so it is necessary to apply a signal having a potential level, which satisfies Vx>OUT+Vthn, to the gate. Also, it is necessary to generate the signal in the state determination circuit.

Assuming herein that a voltage at the power supply terminal is VCC, an ON-resistance of the output MOS is Ron, and a current driven by the output MOS is Iout, an output potential OUT is given by OUT=VCC−Iout·Ron. For example, assuming that VCC=12 V, Iout=70 A, Ron=10 mΩ, and Vthn=1 V, OUT=12 V−70 A×10 mω=11.3 V is established, and therefore Vx>11.3 V+1 V=12.3 V. Accordingly, it is necessary that the gate voltage Vx be equal to or higher than the power supply voltage VCC. This is merely an example, and even if the voltage equal to or higher than the power supply voltage VCC is not applied, the transistor Q3 can be turned on. In the case where the transistor Q3 turns on at a voltage equal to or lower than the power supply voltage VCC, the transistor Q3 operates in a saturation region at the start of the turn-off operation, with the result that the discharge current is limited immediately after the discharge operation is started. In order to achieve the rapid discharge operation using only the transistor Q3 immediately after the start of the discharge operation, it is necessary to apply a high voltage to the gate so that the transistor Q3 can sufficiently drive the current. Also, it is necessary to apply a voltage equal to or higher than the power"

supply voltage VCC to the gate voltage Vx. Therefore, a booster circuit such as a bootstrap is required.

(2) The Case where the Rapid Turn-Off Operation is Accomplished by Activating all the Transistors Q1 to Q3

A potential equal to the power supply voltage level is applied to the gate of the transistor Q3, and the transistors Q1 and Q2 are activated at the same time. In the case where the transistors Q1 and Q2 are depletion transistors, the transistors Q1 and Q2 turn on upon application of a potential equal to the power supply voltage VCC or the output voltage OUT. When the transistors Q1 and Q2 discharge the gate charge of the output MOS and a predetermined amount of electric charge is discharged, the output potential OUT starts to decrease. This enables the transistor Q3 to turn on. Further, when the output voltage OUT decreases with the progress of the discharge operation and when Vgs3>Vds3−Vthn, i.e., Vx−OUT>GATE−OUT+Vthn (where GATE represents the potential of the gate electrode of the output MOS) is satisfied, the transistor Q3 can cause a large discharge current to flow, because the transistor Q3 operates in a linear region.

Thus, when the rapid discharge operation is accomplished by using the transistors Q1 to Q3, the transistor Q3 is not necessarily turned on after the turn-off operation. Therefore, it is sufficient that the voltage GATE to be applied to the gate is equal to the power supply voltage VCC. This eliminates the need to provide a special circuit such as a bootstrap. However, in order to increase the discharge current, it is necessary to increase the size of the transistors, since the transistors Q1 and Q2 carry out the discharge operation immediately after the turn-off operation and the transistors Q1 and Q2 are depletion transistors.

SUMMARY

The present inventors have found a problem as described below. As described above, in order to accomplish the rapid discharge operation using only the transistor Q3 in the output circuit of the prior art shown in FIG. 7, a booster circuit such as a bootstrap is required. Further, in order to accomplish the rapid discharge operation by turning on the transistors Q1 to Q3, it is necessary to increase the size of the transistors Q1 and Q2 which carry out the discharge operation at the start of the turn-off operation. This results in an undesirable increase in the area of the transistors.

A first exemplary aspect of the present invention is a protection circuit that is connected between a power supply terminal and an output terminal, and turns off an output transistor when an abnormality occurs in a system, the output transistor outputting a current to a load connected to the output terminal, the protection circuit including: a first discharge unit that is connected between a gate electrode of the output transistor and the power supply terminal, and discharges an electric charge of the gate electrode until a potential of the gate electrode becomes equal to a power supply potential, when an abnormality occurs in the system, and a second discharge unit that is connected between the gate electrode and a source electrode of the output transistor, and discharges the electric charge of the gate electrode until the potential of the gate electrode becomes equal to an output potential, when an abnormality occurs in the system.

A second exemplary aspect of the present invention is a method of turning off an output transistor when an abnormality occurs in a system, the output transistor being connected between a power supply terminal and an output terminal and outputting a current to a load connected to the output terminal, the method including: discharging, upon detection of an abnormality in the system, an electric charge of the gate electrode of the output transistor until a potential of the gate electrode becomes equal to a power supply potential; and discharging, upon detection of an abnormality in the system, the electric charge of the gate electrode of the output transistor until the potential of the gate electrode becomes equal to an output potential.

According to an exemplary aspect of the present invention, a rapid turn-off operation can be accomplished with a small area by positively utilizing a parasitic bipolar transistor and discharging a gate charge to the power supply terminal at the start of a discharge operation.

BRIEF DESCRIPTION OF THE DRAWINGS

The above and other exemplary aspects, advantages and features will be more apparent from the following description of certain exemplary embodiments taken in conjunction with the accompanying drawings, in which:

FIGS. 2A and 2B are circuit diagrams each showing a protection circuit according to the first exemplary embodiment;

FIGS. 4A to 4D are circuit diagrams each showing a control signal generation circuit according to the first exemplary embodiment;

DETAILED DESCRIPTION OF THE EXEMPLARY EMBODIMENTS

First Exemplary Embodiment

Figure 1A:
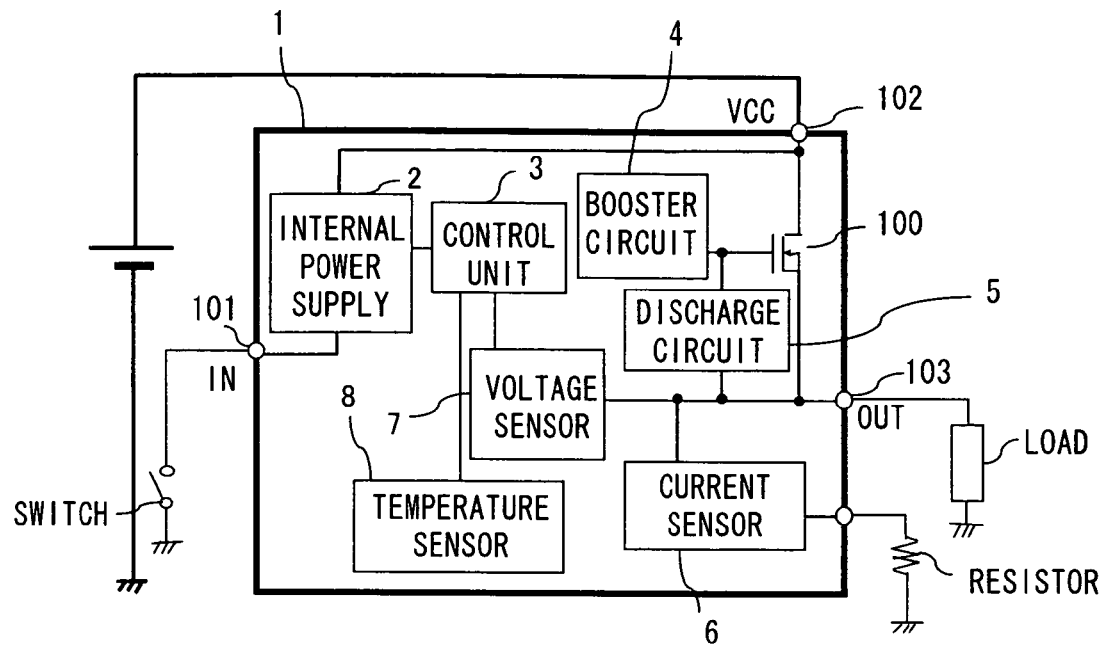
FIG. 1A is a block diagram showing a high-side output circuit according to a first exemplary embodiment of the present invention.

Exemplary embodiments of the present invention will be described below with reference to the accompanying drawings. FIG. 1A is a block diagram showing a high-side output circuit 1 according to a first exemplary embodiment of the present invention. The high-side output circuit according to the first embodiment includes an output MOS 100. The output MOS 100 is connected between a power supply terminal 102 and an output terminal 103, and outputs a current to a load connected to the output terminal 103. The high-side output circuit 1 also includes abnormality detection circuits and a protection circuit. The abnormality detection circuits detect an abnormality in a system. The protection circuit rapidly turns off the output MOS 100 when the abnormality detection circuits detect an abnormality in the system.

In the first exemplary embodiment, the protection circuit is included in a discharge circuit 5. A voltage sensor 7, a temperature sensor 8, and a current sensor 6 are provided as the abnormality detection circuits. The high-side output circuit 1 further includes an internal power supply 2, a control unit 3, and a booster circuit 4.

In order to interrupt energization to the output MOS 100 and to the load when the input is turned off (deactivated) or when an abnormality is detected, the discharge circuit 5 discharges a gate charge of the output MOS 100 to the output terminal 103 so that a potential difference between the gate electrode of the output MOS 100 and the output terminal 103 becomes 0 V.

The booster circuit 4 turns on and off the output MOS 100 during normal operation. The internal power supply 2 supplies power to circuits that need not directly receive a power supply voltage from the outside. The control unit 3 controls a control signal supplied from the outside, an abnormal state detected within the circuit, and other blocks upon restoration to the normal state.

As described above, the high-side output circuit 1 includes the current sensor 6, the temperature sensor 8, and the voltage sensor 7, each of which serves as the abnormality detection circuit that detects an abnormality in the system. The current sensor 6 monitors a load current flowing through the load. The temperature sensor 8 monitors the temperature of the output MOS 100. The voltage sensor 7 monitors a voltage OUT of the output terminal 103. These abnormality detection circuits output an abnormality detection signal to each of the control unit 3 and the discharge circuit 5, upon detection of an abnormality in the circuit. Specifically, the abnormality detection signal is output when the current sensor 6 detects an abnormal magnitude of the load current flowing through the load, when the voltage sensor 7 detects an abnormal voltage OUT of the output terminal 103, or when the temperature sensor 8 detects an abnormal temperature of the output MOS 100. Note that the first exemplary embodiment is described assuming that the high-side output circuit 1 includes the current sensor 6, the voltage sensor 7, and the temperature sensor 8. However, the high-side output circuit 1 may include at least one of these sensors as means for detecting an abnormality in the system.

Figure 1B:
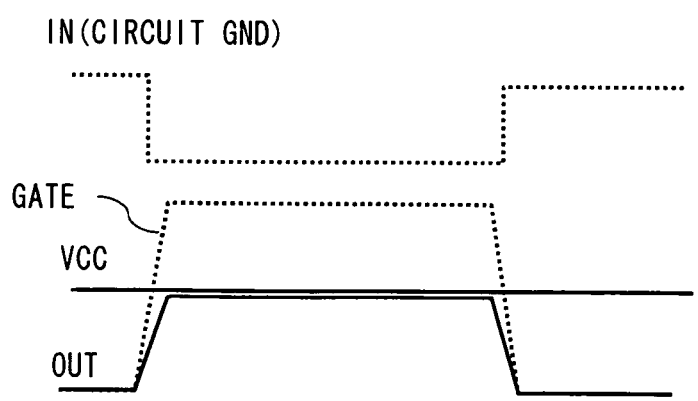
FIG. 1B is a timing diagram showing a variation in potential when the high-side output circuit turns on and off in the normal state.

FIG. 1B is a timing diagram showing potential variations when the high-side output circuit 1 turns on and off in the normal state. FIG. 1B shows an input potential IN, a gate potential GATE of the output MOS 100, a power supply voltage VCC, and a potential of the output voltage OUT. When a switch S turns on and the input voltage IN becomes equal to the ground level, the booster circuit 4 generates a boosted voltage which is higher than the power supply voltage VCC, and supplies the boosted voltage to the gate terminal of the output MOS 100. This allows the output MOS 100 to turn on and allows a current to flow through the load.

Next, the discharge circuit 5 according to the first exemplary embodiment will be described in detail below. FIG. 2A is a circuit diagram showing the discharge circuit 5 according to the first exemplary embodiment. As shown in FIG. 2A, the discharge circuit 5 includes a normal turn-off circuit 10 that performs a turn-off operation in the normal state, and a protection circuit (hereinafter, referred to as a rapid turn-off circuit) 20a that rapidly turns off the output MOS 100 in an abnormal state.

The rapid turn-off circuit 20a includes a first discharge unit and a second discharge unit. The first discharge unit is connected between a gate electrode 104 of the output MOS 100 and the power supply terminal 102. When an abnormality occurs in the system, the first discharge unit discharges the potential GATE of the gate electrode 104 until the potential GATE becomes equal to the power supply potential VCC. The second discharge unit is connected between the gate electrode and the source electrode of the output MOS 100. When an abnormality occurs in the system, the second discharge unit discharges an electric charge of the gate electrode until the potential of the gate electrode becomes equal to the output voltage OUT.

FIG. 2A illustrates only the components located on the surface of a silicon device of the rapid turn-off circuit 20a. Meanwhile, FIG. 2B illustrates the components located on the surface of the silicon device, as well as parasitic bipolar transistors of a second transistor M212 and a third transistor M213.

The first discharge unit includes a first depletion-type transistor M214, the second enhancement-type transistor M212, and the third enhancement-type transistor M213. The first depletion-type transistor M214 has a drain connected to the gate electrode of the output MOS transistor 100, and a gate and a source that are short-circuited. The second enhancement-type transistor M212 has a drain connected to the gate electrode of the output MOS transistor 100, and a gate and a source that are short-circuited. The third enhancement-type transistor M213 is connected between the second transistor M212 and the source electrode of the output MOS transistor 100. Parasitic bipolar transistors Q21 to Q23 of the second transistor M212 discharge the electric charge of the gate electrode until the potential of the gate electrode becomes equal to the power supply potential. A parasitic bipolar transistor Q24 of the third transistor M213 discharges the electric charge of the gate electrode until the potential GATE of the gate electrode becomes equal to the output voltage OUT. The second discharge unit includes a transistor M215 which is connected between the gate electrode and the source electrode of the output MOS 100.

The output MOS 100 is an N-type enhancement transistor having a drain connected to the power supply terminal 102, and a source connected to the output terminal 103. A transistor M211 of the normal turn-off circuit and the first transistor M214 are N-type depletion transistors having a gate and a source that are short-circuited, and operate as constant current sources. The second transistor M212 is an N-type enhancement transistor that is disposed so as to utilize the parasitic bipolar transistors. The third transistor M213 is a P-type enhancement transistor that is disposed so as to prevent the first transistor M214 from discharging the gate charge of the output MOS 100 to the output terminal 103 in the normal state or upon turn-on. The transistor M215 is an N-type enhancement transistor having a source connected to the output terminal 103.

Reference symbols VdepBG1, VdepBG2, and VenhG denote control signals which are generated using circuits shown in FIGS. 4A to 4D as described later.

Next, the parasitic bipolar transistors will be described. FIG. 2B shows the four parasitic bipolar transistors Q21, Q22, Q23, and Q24 that operate during a rapid turn-off operation.

The first to third parasitic bipolar transistors Q21 to Q23 are parasitic bipolar transistors of the second transistor M212. The fourth parasitic bipolar transistor Q24 is a parasitic bipolar transistor of the third transistor 213.

The first parasitic bipolar transistor Q21 discharges the electric charge of the gate electrode of the output MOS 100 to the power supply terminal 102 by using a current from the first transistor M214 as a base current. The second parasitic bipolar transistor Q22 supplies a current to the third and fourth parasitic bipolar transistors Q23 and Q24 by using a current from the first transistor M214 as a base current.

The third parasitic bipolar transistor Q23 discharges the electric charge of the gate electrode of the output MOS 100 to the power supply terminal 102 with a current from the second parasitic bipolar transistor Q22, by using a current from the first transistor M214 as a base current. The fourth parasitic bipolar transistor Q24 discharges the electric charge of the gate electrode of the output MOS 100 to the output terminal 103 with a current from the second parasitic bipolar transistor Q22.

In general, an amplification factor "hfe1" of each of the transistors Q21 and Q23 formed in the longitudinal direction of the transistor is large, while an amplification factor "hfe2" of each of the transistors Q22 and Q24 formed in the lateral direction of the transistor is small.

Figure 3A:
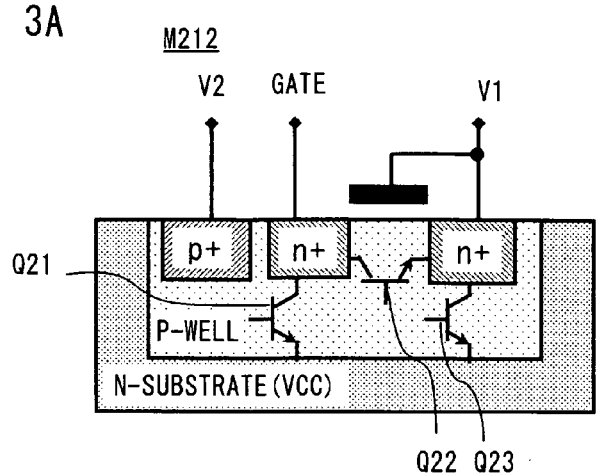
FIGS. 3A to 3C are sectional views each showing a silicon device according to the first exemplary embodiment.
Figure 3B:
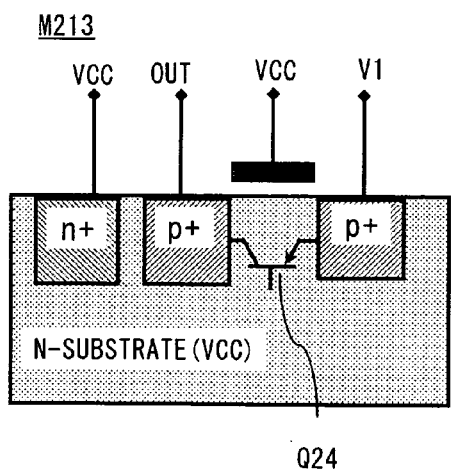
Figure 3C:
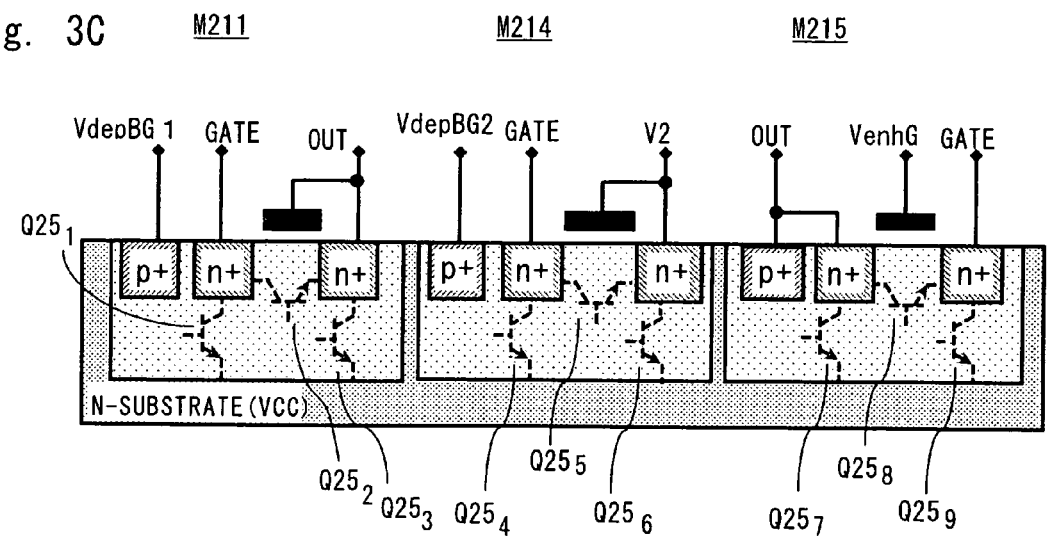

FIGS. 3A to 3C are sectional views each showing a silicon device according to an exemplary embodiment of the present invention. FIG. 3A is a sectional view of the second transistor M212. The parasitic bipolar transistor Q21 operates using the drain of the transistor M212 as a collector, an N-substrate, which is a substrate region, as an emitter, and a P-well, which is formed in the N-substrate, as a base. The parasitic bipolar transistor Q23 operates using the source of the second transistor M212 as a collector, the N-substrate as an emitter, and the P-well as a base. The parasitic bipolar transistor Q22 operates using the drain of the second transistor M212 as a collector, the source of the second transistor M212 as an emitter, and the P-well as a base.

FIG. 3B is a sectional view showing the third transistor M213. The parasitic bipolar transistor Q24 operates using the source of the third transistor M213 as an emitter, the drain of the third transistor M213 as a collector, and the N-substrate as a base.

FIG. 3C is a sectional view showing the transistors M211, M214, and M215. Since the transistors M211, M214, and M215 are N-type transistors, parasitic bipolar transistors $Q25_1$ to $Q25_9$ exist in the longitudinal direction. The backgate voltage VdepBG2 of the transistor M214 is lower than the source potential of the transistor M214 (the gate potential GATE of the MOS 100) and the drain potential of the transistor M214 (a voltage V2). Therefore, the parasitic bipolar transistors $Q25_1$ to $Q25_9$ do not operate. The same is true of the transistors M211 and M215.

FIGS. 4A to 4D are diagrams each showing a control signal generation circuit according to an exemplary embodiment of the present invention. FIG. 4A shows a circuit that generates a voltage GNDX from the power supply voltage VCC. Transistors M216 and M217 are N-type depletion transistors. A transistor M218 is an N-type enhancement transistor. A diode D21 is a Zener diode.

The control signal generation circuit shown in FIG. 4B is a circuit that operates between VCC and GNDX, receives an input signal $S_{IN}$, and generates the control signal VdepBG1 for controlling the backgate of the transistor M211 shown in FIGS. 2A and 2B. A transistor M219 is an N-type depletion transistor. A transistor M220 is a P-type enhancement transistor.

The control signal generation circuit shown in FIG. 4C is a circuit that receives an abnormality detection signal OC and generates the control signal VdepBG2 for controlling the backgate of the transistor M214 shown in FIGS. 2A and 2B. A transistor M221 is an N-type depletion transistor. A transistor M222 is a P-type enhancement transistor.

The control signal generation circuit shown in FIG. 4D is a circuit that receives the abnormality detection signal OC and generates the control signal VenhG for controlling the gate of the transistor M215 shown in FIGS. 2A and 2B. Transistors M223 and M225 are P-type enhancement transistors. Transistors M224 and M226 are N-type depletion transistors.

Next, the operation of each element will be described. The operations shown in FIGS. 4A to 4D are first described.

Herein, the input signal $S_{IN}$ and the abnormality detection signal OC are defined as follows.
(1) Normal ON state (input is active and abnormality detection is inactive) input signal $S_{IN}$=IN, abnormality detection signal OC=IN
(2) Normal OFF state (input is inactive and abnormality detection is inactive) input signal $S_{IN}$=VCC, OC=IN
(3) Abnormality detection state (input is active and abnormality detection is inactive) input signal $S_{IN}$=IN, abnormality detection signal OC=VCC
(1) Normal ON State The transistor M218 shown in FIG. 4A fully turns on, because the transistor M218 receives an input inversion signal $S_{IN\_B}$=VCC at the gate. The transistor M216 operates as a constant current source. Assuming that the diode D21 has a breakdown voltage of VZe, GNDX=VCC−VZe is satisfied. In the normal ON state, the transistor M217 also causes a constant current to flow. Thus, the constant current flowing through the transistor M217 and the current flowing through the diode D21 flow through the transistor M216.

The transistor M219 shown in FIG. 4B operates as a constant current source. The transistor M220 turns on upon receiving $S_{IN}$=GND at the gate, and the control signal VdepBG1 becomes "L" level. Note that it is necessary to connect an n$^+$ region serving as a backgate of a P-type transistor to the potential VCC of the N-substrate, because the discharge circuit according to the first exemplary embodiment includes the P-well formed in the N-substrate. Accordingly, in the connected state of the transistor M220, the backgate effect is produced. As a result, VdepBG2=GNDX is not met, and a voltage which is about 2 V higher than GNDX is obtained, for example. Such a state is hereinafter represented by VdepBG2=GNDX+α.

The transistor M222 shown in FIG. 4C receives OC=IN and operates in a similar manner as in FIG. 4B, and VdepBG2=IN+α is satisfied. Referring to FIG. 4D, the transistor M223 receives OC=IN, and an inverter composed of the transistors M223 and M224 outputs the potential VCC. Further, an inverter composed of the transistors M225 and M226 outputs the potential OUT. Each of the input and output levels is equal to the "L" level, but the level is shifted from the input voltage IN to the output voltage OUT.
(2) Normal OFF State The transistor M218 shown in FIG. 4A receives the input inversion signal $S_{IN\_B}$=VCC at the gate, and the transistor M218 is cut off. As a result, the transistors M216 and M217 also turn off and the drain-source voltage becomes 0 V. Accordingly, GNDX=VCC is satisfied. The transistor M220 shown in FIG. 4B receives the input signal $S_{IN}$=IN and is cut off. As a result, the transistor M219 also turns off and the drain-source voltage Vds becomes 0 V (Vds=0 V). Accordingly, VdepBG1=OUT is satisfied. Referring to FIGS. 4C and 4F, in the normal OFF state, OC=IN is maintained as in the normal ON state. Therefore, VdepBG2=GNDX+α and VenhG=OUT are satisfied.
(3) Abnormality Detection State Referring to FIGS. 4A and 4B, $S_{IN\_B}$=VCC and $S_{IN}$=IN are maintained as in the normal ON state. Accordingly, GNDX=VCC−VZe and VdepBG1=GNDX+α are satisfied. Referring to FIG. 4C, the transistor M222 receives OC=VCC at the gate, so the transistor M222 is cut off and VdepBG2=OUT is satisfied. Referring to FIG. 4D, the transistor M223 receives OC=VCC at the gate and outputs VenhG=VCC through the two-stage inverters.

Thus, the signal output in the normal ON state, the signal output in the normal OFF state, and the signal in the abnormality detection state are defined as follows.
(1) Normal ON State
input signal $S_{IN}$=IN, abnormality detection signal OC=IN
VdepBG1=GNDX+α
VdepBG2=IN+α
VenhG=OUT
(2) Normal OFF State
input signal $S_{IN}$=VCC, abnormality detection signal OC=IN
VdepBG1=OUT
VdepBG2=IN+α
VenhG=OUT
(3) Abnormality Detection State
input signal $S_{IN}$=IN, abnormality detection signal OC=VCC
VdepBG1=GNDX+α
VdepBG2=OUT
VenhG=VCC Next, a description is given of the operation of the discharge circuit shown in FIG. 2B which receives these signals.
(1) Normal ON State The transistor M211 receives VdepBG1=GNDX+α at the backgate, and thus a backgate-source voltage Vbs211=VdepBG1−OUT is satisfied. In the normal ON state, the output MOS transistor 100 fully turns on, so the voltage OUT is nearly equal to the voltage VCC (OUT≈VCC). Accordingly, Vbs211=(GNDX+α)−VCC=(VCC−VZe+α)−VCC=−VZe+α is satisfied. Assuming that VZe=5V and α=2V, the backgate-source voltage Vbs211 is −3 V (Vbs211=−3 V), and thus the transistor M211 is cut off.

Further, the second transistor M212 turns off in any state, since the gate and source thereof are short-circuited. The third transistor M213 turns off in any state, as with the second transistor M212, since the third transistor M213 receives the voltage VCC at the gate. The transistor M214 receives IN+α at the backgate, so a backgate-source voltage Vbs214=VdepBG2−OUT=(IN+α)−VCC=−VCC+α is established, for example. Assuming that VCC=12 V and α=2 V, the backgate-source voltage is −10V (Vbs214=−10V), and thus the transistor M214 is cut off.

Since the transistor M214 is cut off, the base current of each of the parasitic bipolar transistors Q21 to Q23 is zero, with the result that the parasitic bipolar transistors Q21 to Q23 turn off. Further, since the second transistor M212 and the first transistor M214 are cut off, no current flows to the parasitic bipolar transistor Q24, with the result that the parasitic bipolar transistor Q24 turns off. The transistor M215 receives the potential of VenhG=OUT at the gate, and a gate-source voltage Vgs215 is 0 V (Vgs215=0 V), and thus the transistor M215 is cut off. As described above, since all the transistors turn off, the gate charge of the output MOS 100 is not discharged. Therefore, the normal ON state is maintained.
(2) Turn-Off Operation in the Normal State In the normal OFF state, the transistor M211 receives the signal VdepBG1=OUT at the backgate, so the transistor M211 operates as a constant current source and discharges the gate charge of the output MOS 100 to the output terminal 103. The second transistor M212, the third transistor M213, the transistor M214, and the transistor M215 turn off, because the transistors remain in the same state as the normal ON state. The parasitic bipolar transistors Q21 to Q24 also turn off. As described above, only the transistor M211 turns on to serve as a constant current source, and discharges the gate charge of the output MOS 100 to be turned off. The slew rate in the turn-off operation can be adjusted through adjustment of the current ability of the transistor M211.

(3) Turn-Off Operation in the Abnormality Detection State

In the abnormality detection state, the transistor M211 is cut off in the same manner as in the normal ON state. Further, the second transistor M212 and the third transistor M213 are cut off as in the same manner as in the normal ON state and the normal OFF state.

Now, a description is given of the first discharge unit that discharges the gate potential GATE until the gate potential GATE becomes equal to the power supply voltage VCC when an abnormality occurs in the system. The first transistor M214 receives the potential OUT of the output terminal 103 at the backgate, and operates as a constant current source. A current flowing through the first transistor M214 serves as a base current of the parasitic bipolar transistors Q21 to Q23. The parasitic bipolar transistor Q21 amplifies the base current, which is received from the first transistor M214, by hfe1, and discharges the gate charge of the output MOS 100 to the power supply terminal 102.

Similarly, the parasitic bipolar transistor Q22 causes a current obtained by amplifying the base current by hfe2 to flow through the parasitic bipolar transistors Q23 and Q24. Note that the parasitic bipolar transistor Q22 has a current amplification factor smaller than that of the parasitic bipolar transistor Q23, since the parasitic bipolar transistor Q22 is a lateral bipolar transistor. Also the parasitic bipolar transistor Q23 receives the base current of the first transistor M214, and causes a part of a current flowing through the parasitic bipolar transistor Q22 to flow as a discharge current for discharging the gate charge of the output MOS 100 to the power supply terminal 102.

Further, a part of a current flowing through the parasitic bipolar transistor Q22 flows from the emitter to the base of the parasitic bipolar transistor Q24. Thus, a part of the current flowing through the parasitic bipolar transistor Q22 flows as a discharge current from the gate of the output MOS 100 to the output terminal 103. Note that the current flowing through the parasitic bipolar transistors Q23 and Q24 is determined by the parasitic bipolar transistor Q22 located on the collector side, and the parasitic bipolar transistor Q22 has a small amplification factor. Thus, the amount of discharge current flowing through the parasitic bipolar transistors Q23 and Q24 is not as large as that of the parasitic bipolar transistor Q21. By these operations, the electric charge is discharged from the gate of the output MOS 100 to the power supply terminal 102.

Next, a description is given of the second discharge unit that discharges the potential GATE of the gate electrode until the potential GATE becomes equal to the output potential OUT. When the first discharge unit discharges the gate charge of the output MOS 100 to the power supply terminal 102, the gate voltage GATE of the output MOS 100 starts to decrease. When a predetermined amount of gate charge is discharged, the potential OUT starts to decrease. The transistor M215 receives VenhG=VCC at the gate. Accordingly, when the output voltage OUT decreases and the gate-source voltage Vgs215 of the transistor M215=VCC−OUT>Vthn is satisfied, the transistor M215 turns on and contributes to the discharge operation. Further, when the output voltage OUT decreases and Vgs215>Vds215−Vthn⇔(VCC−OUT)>(GATE−OUT)>Vthn is satisfied, the transistor M215 operates in a linear region. This allows a large discharge current to flow. Thus, the second discharge unit discharges the electric charge until the gate potential of the output MOS 100 becomes equal to the potential of the output voltage OUT.

The operations to be performed upon detection of an abnormality are summarized below. At the start of the turn-off operation, the parasitic bipolar transistors Q21 to Q24 that constitute the first discharge unit discharge the gate charge of the output MOS 100 to the power supply terminal 102, and discharge the gate electrode of the output MOS 100 to the output terminal 103, thereby lowering the potential of the output voltage OUT. Then, the transistor M215 that constitutes the second discharge unit turns on to discharge the remaining gate charge of the output MOS 100 to the output terminal 103, thereby turning off the output MOS 100. Such a configuration in which both the first discharge unit and the second discharge unit discharge the gate charge makes it possible to accomplish the rapid turn-off operation.

The distribution of the current, which flows through the first transistor M214 and serves as a base current, to the bases of the parasitic bipolar transistors Q21 to Q23 is determined by a resistance across the source of the first transistor M214 and the base of each of the parasitic bipolar transistors Q21 to Q23. To increase the discharge current from the gate of the output MOS 100, the current is amplified to a larger degree. In order to this, it is effective to increase the base current of the parasitic bipolar transistor Q21, and it is desirable to reduce the resistance across the source of the first transistor M214 and the base of the parasitic bipolar transistor Q21.

Next, a modified example of the exemplary embodiment of the first exemplary embodiment will be described. In the first exemplary embodiment, the control signal generation circuit shown in FIG. 4C is provided between OUT and GND. Alternatively, even if the control signal generation circuit is provided between OUT and GNDX, the same effects of the rapid turn-off operation can be obtained. Note that when the voltage GNDX is used instead of the GND voltage, VdepBG2=OUT is satisfied also in the normal OFF state. Accordingly, the first transistor M214 turns on and the parasitic bipolar transistors Q21 to Q24 operate, with the result that the discharge process advances rapidly immediately after the turn-off operation is started.

However, when the gate voltage GATE of the output MOS 100 decreases to a voltage in the vicinity of the power supply voltage VCC, the parasitic bipolar transistors Q21 to Q23 stop discharging the electric charge of the gate electrode of the output MOS 100 to the power supply terminal 102, and only the parasitic bipolar transistor Q24 continues to discharge the gate charge of the gate electrode to the output terminal 103. The parasitic bipolar transistor Q24 does not amplify the current flowing through the first transistor M214 to a large extent, since the parasitic bipolar transistor Q24 has a small amplification factor. Further, the transistor M215 does not perform the rapid discharge operation, since the transistor M215 receives the voltage OUT at the gate and is cut off. After the parasitic bipolar transistors Q21 to Q23 stop the discharge operation, the slew rate is determined by the parasitic bipolar transistor Q24 and the transistor M211. Accordingly, the slew rate is suppressed during the turn-off operation.

At the start of the turn-off operation, noise may occur, because the slew rate increases owing to the operation of the parasitic bipolar transistors Q21 to Q24. However, the noise may be negligible depending on the application. Further, the circuit shown in FIG. 4C may be provided between OUT-GNDX.

Second Exemplary Embodiment

Next, a second exemplary embodiment of the present invention will be described. As described in the first exemplary embodiment, the rapid discharge operation is accomplished using the parasitic bipolar transistor Q21 of the second transistor M212. However, the channel region of the second transistor M212 does not contribute to the discharge operation, and each discharge path formed of the parasitic bipolar transistors Q22 to Q24 has a current amplification factor smaller than that of the parasitic bipolar transistor Q21. Therefore, it is desirable to cause the current flowing through the first transistor M214 to flow not to the base of each of the parasitic bipolar transistors Q22 to Q24 but to the base of the parasitic bipolar transistor Q21. In the second exemplary embodiment, this situation is improved.

Figure 5A:
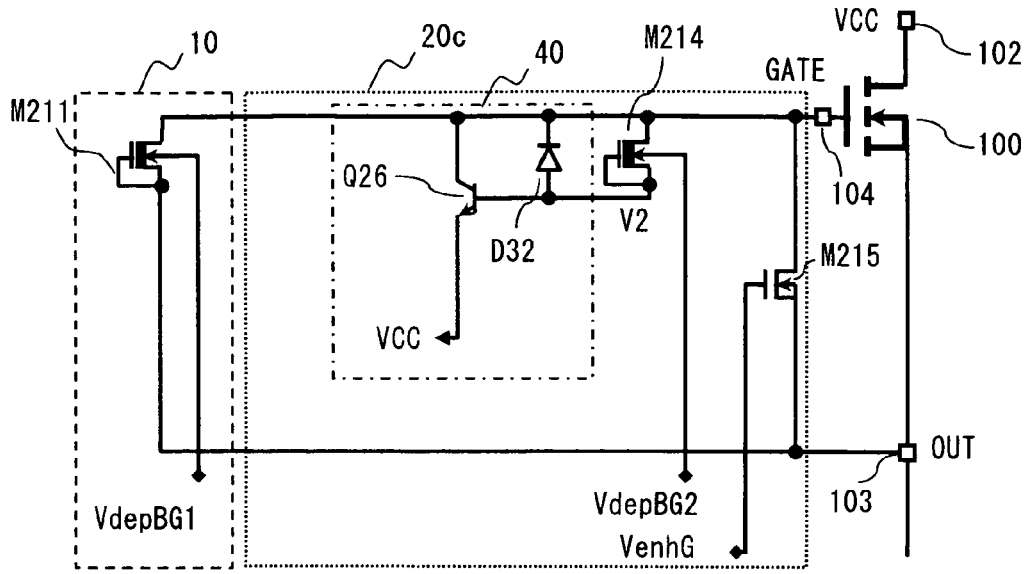
FIG. 5A is a circuit diagram showing a discharge circuit according to a second exemplary embodiment of the present invention.

FIG. 5A is a diagram showing a discharge circuit according to the second exemplary embodiment of the present invention. Components of the discharge circuit shown in FIG. 5A that are identical to those of the discharge circuit according to the first exemplary embodiment shown in FIG. 2B are denoted by the same reference symbols, and the detailed description thereof is omitted.

The discharge circuit shown in FIG. 5A includes the normal turn-off circuit 10 that performs a turn-off operation in the normal state, and a rapid turn-off circuit 20c that rapidly turns off the output MOS 100 in the abnormality state. As with FIG. 2A, the output MOS 100 is an N-type enhancement transistor having a drain connected to the power supply terminal 102, and a source connected to the output terminal 103. The transistors M211 and M214 are N-type depletion transistors whose gate and source are short-circuited, and serve as constant current sources. The transistor M215 is an N-type enhancement transistor having a source connected to the output terminal 103. A diode D32 includes $p^+$ and $n^+$ regions. A parasitic bipolar transistor Q26 is formed by adding the diode D32. Reference symbols VdepBG1, VdepBG2, VenhG in FIG. 5A denote control signals which are generated using the control signal generation circuits shown in FIGS. 4A to 4D.

Figure 5B:
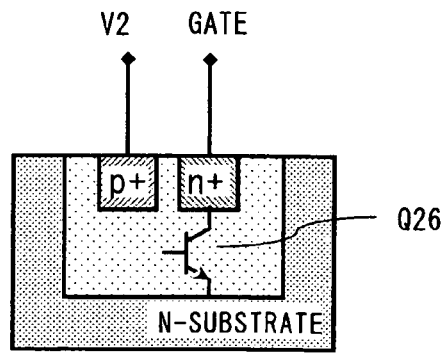
FIG. 5B is a sectional view of a silicon device according to the second exemplary embodiment.

FIG. 5B is a sectional view showing the diode D32. The parasitic bipolar transistor Q21 operates using the cathode of the diode D32 as a collector, the P-well as a base, and the N-substrate as an emitter.

Next, the operation of the discharge circuit according to the second exemplary embodiment will be described. The normal turn-off operation of the second exemplary embodiment is similar to that of the first exemplary embodiment.

Now, the turn-off operation in the abnormality detection state will be described. As with the first exemplary embodiment, the first transistor M214 receives the voltage OUT at the backgate and operates as a constant current source.

The operation of the first discharge unit is described below. A current flowing through the first transistor M214 serves as a base current of the parasitic bipolar transistor Q26. The parasitic bipolar transistor Q26 amplifies the base current, which is received from the first transistor M214, by hfe1, and discharges the gate charge of the output MOS 100 to the power supply terminal 102.

Next, the operation of the second discharge unit is described below. When the first discharge unit discharges the electric charge of the gate electrode of the output MOS 100 to the power supply terminal 102, the gate potential GATE of the output MOS 100 starts to decrease. When a predetermined amount of gate charge is discharged, the potential OUT starts to decrease. The transistor M215 receives VenhG=VCC at the gate, so when the potential of the output terminal 103 decreases and the gate-source voltage Vgs215 of the transistor M215=VCC−OUT>Vthn is satisfied, the transistor M215 turns on and contributes to the discharge operation. Further, when the potential OUT decreases and Vgs215>Vds215−Vthn⇔(VCC−OUT)>(GATE−OUT)>Vthn is satisfied, the transistor M215 operates in the linear region. This allows a large discharge current to flow. The second discharge unit discharges the potential GATE of the gate electrode of the output MOS 100 until the potential GATE becomes equal to the potential of the output voltage OUT.

The operations to be performed upon detection of an abnormality are summarized below. At the start of the turn-off operation, the whole current flowing through the first transistor M214 of the first discharge unit serves as the base current of the parasitic bipolar transistor Q26. Further, the parasitic bipolar transistor Q26 discharges the gate charge of the output MOS 100 to the power supply terminal 102, and discharges the gate charge of the output MOS 100 to the output terminal 103, thereby lowering the potential of the output terminal 103. Then, the transistor M215 that constitutes the second discharge unit turns on to discharge the remaining gate charge of the output MOS 100 to the output terminal 103, thereby turning off the output MOS 100. Such a configuration in which both the first discharge unit and the second discharge unit discharge the gate charge makes it possible to accomplish the rapid turn-off operation.

In the second exemplary embodiment, the diode D32 including the p$^+$ and n$^+$ regions is disposed so as to generate only the bipolar transistor corresponding to the paratactic bipolar transistor Q21 shown in FIG. 2B, unlike the first exemplary embodiment in which parasitic bipolar transistors are obtained by disposing the N-type enhancement transistor such as the transistor M212. The parasitic bipolar transistor Q26 equivalent to the parasitic bipolar transistor Q21 shown in FIG. 2B is obtained by disposing the diode formed in the P-well. Consequently, the same effects as those of the first exemplary embodiment can be obtained. Further, the path existing between the transistor M214 and the output terminal 103 in FIG. 2B is eliminated. This eliminates the need to provide the third transistor M213.

According to the second exemplary embodiment, the whole current flowing through the first transistor M214 serves as the base current of the parasitic bipolar transistor Q26 in the first discharge unit. Accordingly, the whole current flowing through the first transistor M214 is amplified by hfe1. This makes it possible to increase the discharge current compared to the first exemplary embodiment. Further, there is no need to provide the third transistor M213 shown in FIG. 2B and the n$^+$ region which constitutes the channel region of the transistor shown in FIG. 3A and the parasitic bipolar transistor Q23. Therefore, the rapid turn-off circuit can be produced with a small area.

Figure 6A:
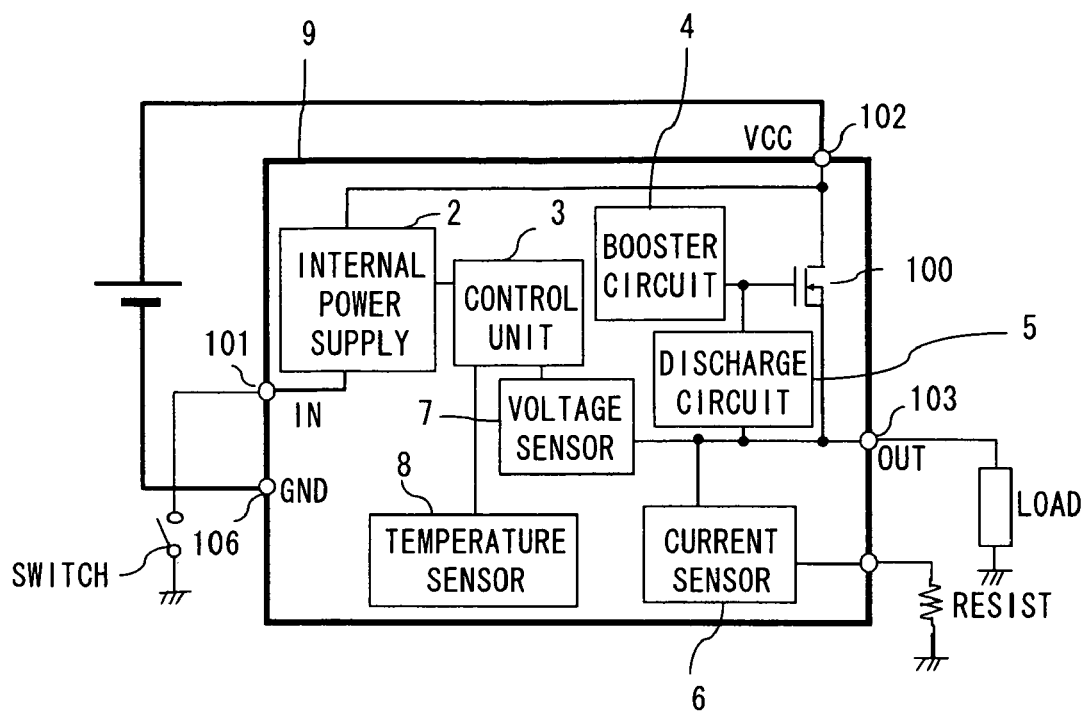
FIGS. 6A and 6B show a modified example of a high-side output circuit according to an exemplary embodiment of the present invention.
Figure 6B:
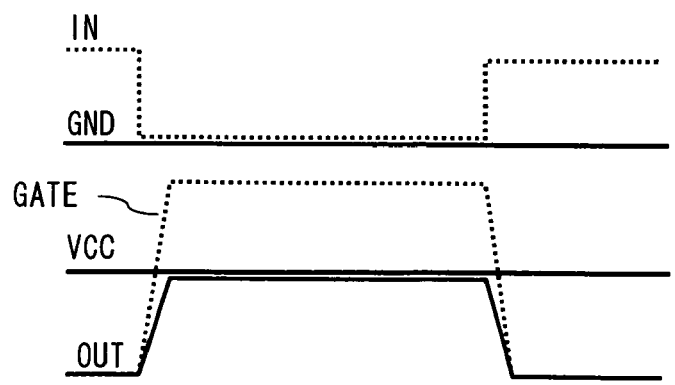
Figure 7:
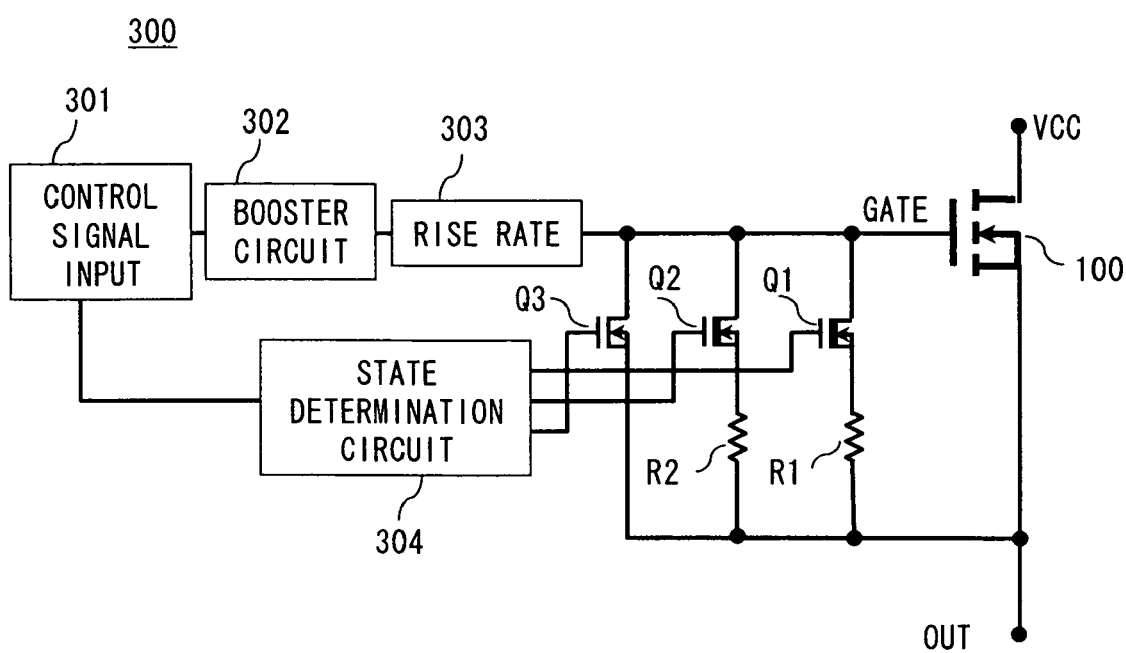
FIG. 7 is a circuit diagram showing an output circuit according to the prior art.

Note that the present invention is not limited to the above exemplary embodiments, and can be modified in various manners without departing from the scope of the present invention. For example, FIG. 6A is a block diagram showing another system according to an exemplary embodiment of the present invention. A high-side output circuit according to this exemplary embodiment shown in FIG. 6A includes a GND terminal 106 which is not included in the high-side output circuit shown in FIG. 1A. Also in the circuit having the GND terminal, the rapid turn-off operation for the output MOS can be accomplished using the discharge circuit similar to that described above. Since the high-side output circuit shown in FIG. 6A has the GND terminal, each circuit shown in FIG. 4 can use the GND potential instead of the input voltage IN.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A protection circuit that is connected between a power supply terminal and an output terminal, and turns off an output transistor when an abnormality occurs in a system, the output transistor outputting a current to a load connected to the output terminal, the protection circuit comprising:
   a first discharge unit that is connected between a gate electrode of the output transistor and the power supply terminal, and discharges an electric charge of the gate electrode until a potential of the gate electrode becomes equal to a power supply potential, when an abnormality occurs in the system;
   a second discharge unit that is connected between the gate electrode and a source electrode of the output transistor, and discharges the electric charge of the gate electrode until the potential of the gate electrode becomes equal to an output potential, when an abnormality occurs in the system; and
   a normal turn-off circuit that is connected between the gate electrode and the source electrode of the output transistor, and includes a depletion-type transistor that turns off the output transistor when the system is in a normal state.

2. The protection circuit according to claim 1, wherein the second discharge unit comprises a transistor connected between the gate electrode and the source electrode.

3. The protection circuit according to claim 1, wherein:
   the first discharge unit comprises:
      a first depletion-type transistor having a drain connected to the gate electrode of the output transistor, and a gate and a source that are short-circuited; and
      a diode connected between the gate electrode of the output transistor and the source of the first transistor, and
   a parasitic bipolar transistor of the diode causes the discharge.

4. The protection circuit according to claim 1, wherein:
   the first discharge unit comprises:
      a first depletion-type transistor having a drain connected to the gate electrode of the output transistor, and a gate and a source that are short-circuited;
      a second enhancement-type transistor having a drain connected to the gate electrode of the output transistor, and a gate and a source that are short-circuited; and
      a third enhancement-type transistor connected between the second transistor and the source electrode of the output transistor,
      a parasitic bipolar transistor of the second transistor discharges an electric charge of the gate electrode until the potential of the gate electrode becomes equal to the power supply voltage, and
      a parasitic bipolar transistor of the third transistor discharges an electric charge of the gate electrode until the potential of the gate electrode becomes equal to the output potential.

5. The protection circuit according to claim 3, wherein the output transistor comprises an N-type transistor formed in a P-well formed in an N-type semiconductor substrate.

6. The protection circuit according to claim 4, wherein:
   the first transistor and the second transistor are N-type transistors, and
   the third transistor comprises a P-type transistor.

7. The protection circuit according to claim 6, wherein the parasitic bipolar transistor comprises a parasitic bipolar transistor of the diode, and discharges an electric charge of the gate electrode of the output transistor to the power supply terminal by using a current from the first transistor as a base current.

8. The protection circuit according to claim 6, wherein:
the parasitic bipolar transistor comprises first to third parasitic bipolar transistors serving as parasitic bipolar transistors of the second transistor, and a fourth parasitic bipolar transistor serving as a parasitic bipolar transistor of the third transistor,
the first parasitic bipolar transistor discharges an electric charge of the gate electrode of the output transistor to the power supply terminal by using a current from the first transistor as a base current,
the second parasitic bipolar transistor supplies a current to the third and fourth parasitic bipolar transistors by using the current from the first transistor as the base current,
the third parasitic bipolar transistor discharges the electric charge of the gate electrode of the output transistor to the power supply terminal with a current from the second parasitic bipolar transistor, by using the current from the first transistor as the base current, and
the fourth parasitic bipolar transistor discharges the electric charge of the gate electrode of the output transistor to the output terminal with the current from the second parasitic bipolar transistor.

9. A high-side output circuit that switches a current flowing through a load, comprising:
an output transistor that is connected between a power supply terminal and an output terminal, and outputs a current to the load connected to the output terminal;
a normal turn-off circuit that is connected between a gate electrode and a source electrode of the output transistor, and includes a depletion-type transistor that turns off the output transistor when a system is in a normal state;
an abnormality detection circuit that detects an abnormality in the system; and
a protection circuit that turns off the output transistor when the abnormality detection circuit detects an abnormality in the system,
wherein the protection circuit comprises:
a first discharge unit that is connected between a gate electrode of the output transistor and the power supply terminal, and discharges an electric charge of the gate electrode until a potential of the gate electrode becomes equal to a power supply potential, when an abnormality occurs in the system; and
a second discharge unit that is connected between the gate electrode and a source electrode of the output transistor, and discharges the electric charge of the gate electrode until the potential of the gate electrode becomes equal to an output potential, when an abnormality occurs in the system.

10. The high-side output circuit according to claim 9, wherein the abnormality detection unit comprises at least one of:
a current sensor that detects an abnormality of a load current flowing through the load;
a temperature sensor that detects a temperature of the output transistor; and
an output voltage sensor that detects a voltage of the output terminal.

11. A method of turning off an output transistor when an abnormality occurs in a system, the output transistor being connected between a power supply terminal and an output terminal and outputting a current to a load connected to the output terminal, the method comprising:
discharging, upon detection of an abnormality in the system, an electric charge of the gate electrode of the output transistor until a potential of the gate electrode becomes equal to a power supply potential;
discharging, upon detection of an abnormality in the system, the electric charge of the gate electrode of the output transistor until the potential of the gate electrode becomes equal to an output potential; and
discharging, upon detection of a normality in the system, the electric charge of the gate electrode of the output transistor via a depletion-type transistor that couples between the gate electrode of the output transistor and the output terminal.

* * * * *